United States Patent
Caulfield et al.

(10) Patent No.: US 11,108,894 B2
(45) Date of Patent: Aug. 31, 2021

(54) MASKED PACKET CHECKSUMS FOR MORE EFFICIENT DIGITAL COMMUNICATION

(71) Applicant: Microsoft Technology Licensing, LLC, Redmond, WA (US)

(72) Inventors: Adrian Michael Caulfield, Woodinville, WA (US); Michael Konstantinos Papamichael, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 43 days.

(21) Appl. No.: 16/537,521

(22) Filed: Aug. 9, 2019

(65) Prior Publication Data
US 2021/0044679 A1 Feb. 11, 2021

(51) Int. Cl.
*H04L 29/06* (2006.01)
*H04L 12/823* (2013.01)
*H03M 13/09* (2006.01)

(52) U.S. Cl.
CPC ............ *H04L 69/22* (2013.01); *H04L 47/32* (2013.01); *H03M 13/09* (2013.01)

(58) Field of Classification Search
CPC ............................. H04L 69/22; H03M 13/09
See application file for complete search history.

(56) References Cited

U.S. PATENT DOCUMENTS

| | | | |
|---|---|---|---|
| 8,462,689 B2* | 6/2013 | Johnson | H04L 1/0041 370/314 |
| 2006/0190772 A1* | 8/2006 | Hanaoka | H04L 1/0082 714/38.12 |
| 2007/0234134 A1* | 10/2007 | Shao | H04L 1/007 714/701 |
| 2007/0240191 A1 | 10/2007 | Singh et al. | |
| 2009/0296921 A1* | 12/2009 | Jeanne | H04L 7/048 379/416 |

(Continued)

OTHER PUBLICATIONS

Larzon, et al., "The UDP Lite Protocol", Retrieved From: draft-larzon-udplite-00.txt, Feb. 26, 1999, 9 pages.

(Continued)

*Primary Examiner* — Fahmida S Chowdhury
(74) *Attorney, Agent, or Firm* — Watson Patents, PLC; Vladan M. Vasiljevic

(57) ABSTRACT

A masked packet checksum is utilized to provide error detection and/or error correction for only discrete portions of a packet, to the exclusion of other portions, thereby avoiding retransmission if transmission errors appear only in portions excluded by the masked packet checksum. A bitmask identifies packet portions whose data is to be protected with error detection and/or error correction schemes, packet portions whose data is to be excluded from such error detection and/or error correction schemes, or combinations thereof. A bitmask can be a per-packet specification, incorporated into one or more fields of individual packets, or a single bitmask can apply equally to multiple packets, which can be delineated in numerous ways, and can be separately transmitted or derived. Bitmasks can be generated at higher layers with lower layer mechanisms deactivated, or can be generated lower layers based upon data passed down.

20 Claims, 8 Drawing Sheets

(56) References Cited

U.S. PATENT DOCUMENTS

| | | | |
|---|---|---|---|
| 2012/0216084 A1* | 8/2012 | Chun | H04L 12/12 |
| | | | 714/708 |
| 2014/0068357 A1* | 3/2014 | Georges | H04L 43/0823 |
| | | | 714/704 |
| 2014/0195639 A1* | 7/2014 | Kamen | H04L 67/10 |
| | | | 709/217 |
| 2017/0332241 A1* | 11/2017 | Liu | H04L 1/0079 |

OTHER PUBLICATIONS

"International Search Report and Written Opinion Issued in PCT Application No. PCT/US20/037975", dated Sep. 30, 2020, 14 Pages.

* cited by examiner

MASKED PACKET CHECKSUMS FOR MORE EFFICIENT DIGITAL COMMUNICATION

BACKGROUND

Computer network communications between a transmitting computing device and a receiving computing device typically entail the transmitting computing device dividing the digital data to be sent into discrete packets and transmitting the packets across the computer network, and typically entail the receiving computing device receiving the packets from the computer network and re-assembling the digital data therefrom. Because computer network communications can be transmitted across lossy communication media, error detection and/or error correction schemes are often utilized. One common error detection scheme can entail the utilization of error detection codes on a per packet basis. A received packet whose error detection code does not match an expected value can be discarded, and, if appropriate, the receiving computing device can request the transmitting computing device to retransmit the discarded packet.

Each retransmission renders the overall computer network communication less efficient, such as by reducing the throughput of the digital data being transmitted between the transmitting computing device and the receiving computing device. In some instances, error detection may not be applied to computer network communications, thereby increasing the throughput of the digital data being transmitted between the transmitting computing device and the receiving computing device. In such instances, however there is no mechanism to determine whether or not any portion of a received packet was received properly, and, as a result, such mechanisms are can only be properly utilized where the receiving computing device is agnostic as to the correctness of any particular packet.

SUMMARY

A masked packet checksum can be utilized to provide error detection and/or error correction for only discrete portions of a packet, to the exclusion of other portions, thereby avoiding the inefficiency of retransmission if errors in the transmission of the packet appear only in the portions excluded by the masked packet checksum. In such a manner, error detection and/or error correction can be tuned based on particular communication needs, and, consequently, more efficient digital communication can be enabled if complete error detection and/or error correction is not required. A bitmask can identify portions of a packet whose data is to be protected with error detection and/or error correction schemes, portions of a packet whose data is to be excluded from such error detection and/or error correction schemes, or combinations thereof. A bitmask can be a per-packet specification, and can be incorporated into one or more fields of individual packets. A single bitmask can also apply equally to multiple packets, which can be delineated based upon packet identifiers, the source generating such packets, specific communication streams, or other like communicational constructs. Such bitmasks can be transmitted separately from the multiple packets, or can be commonly derived by the transmitting and receiving computing devices independently from one another based upon shared seed information. The identification of portions of the packet whose data is to be protected with error detection and/or error correction schemes can be based upon coded enumerations that can be directly decipherable, or which can be compressed and deciphered by reference to external resources, such as a dictionary of identification options. Bitmasks can be generated at the highest layer that still does error detection and/or error correction, with error detection and/or error correction provided by lower layers being deactivated, or bitmasks can be generated at the lowest layer based upon data passed down from higher layers.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
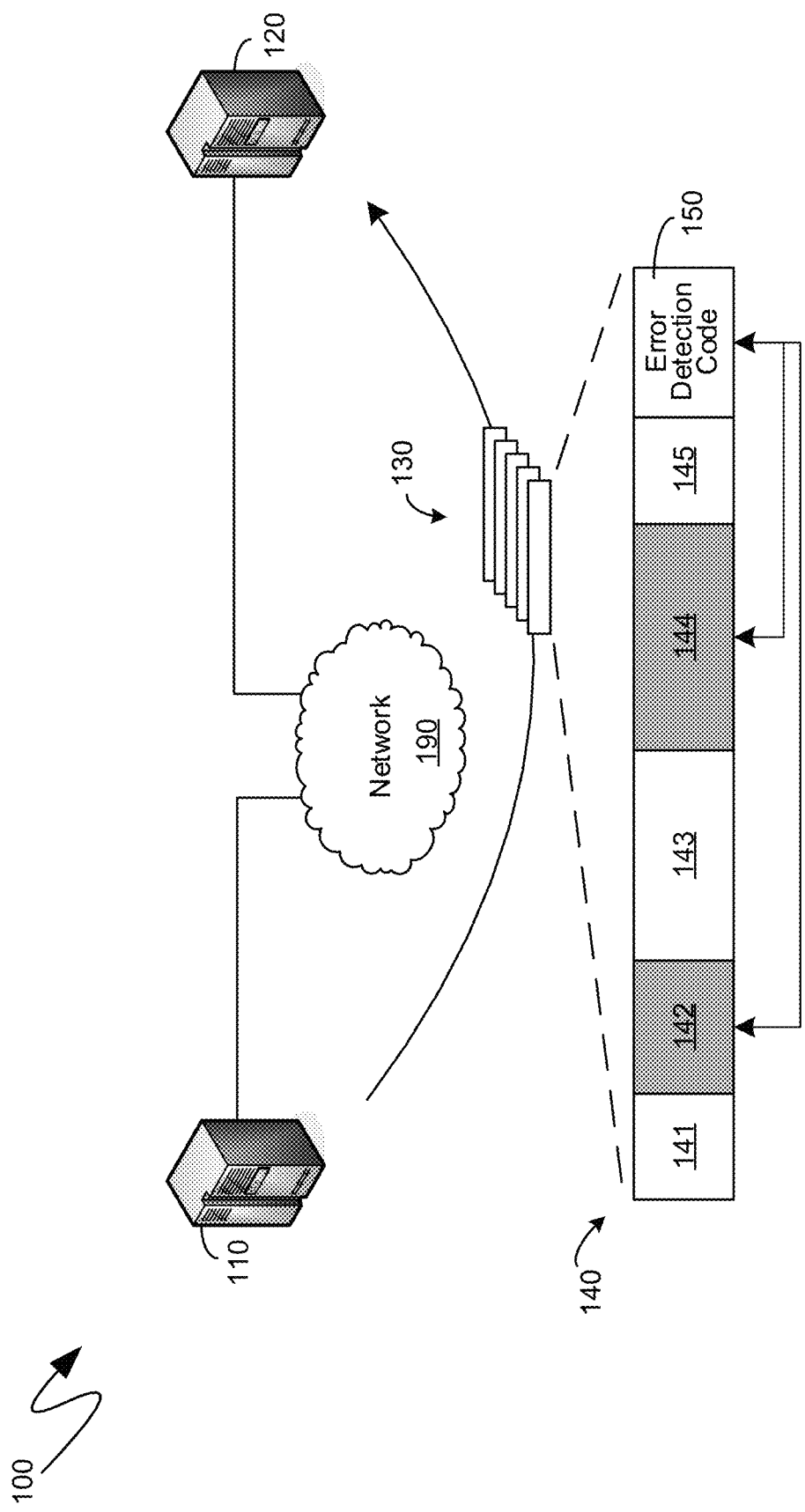
FIG. 1 is a system diagram of an exemplary system utilizing masked packet checksums.

The following description relates to mechanisms for tuning error detection and/or error correction to apply only to identified, discrete portions of a packet, to the exclusion of other portions, thereby avoiding the inefficiency of retransmission if errors in the transmission of the packet appear only in the excluded portions. A masked packet checksum can be utilized to perform such tuning. In such a manner, error detection and/or error correction can be tuned based on particular communication needs, and, consequently, more efficient digital communication can be enabled if complete error detection and/or error correction is not required. A bitmask can identify portions of a packet whose data is to be protected with error detection and/or error correction schemes, portions of a packet whose data is to be excluded from such error detection and/or error correction schemes, or combinations thereof. A bitmask can be a per-packet specification, and can be incorporated into one or more fields of individual packets. A single bitmask can also apply equally to multiple packets, which can be delineated based upon packet identifiers, the source generating such packets, specific communication streams, or other like communicational constructs. Such bitmasks can be transmitted separately from the multiple packets, or can be commonly derived by the transmitting and receiving computing devices independently from one another based upon shared seed information. The identification of portions of the packet whose data is to be protected with error detection and/or error correction schemes can be based upon coded enumerations that can be directly decipherable, or which can be compressed and deciphered by reference to external resources, such as a dictionary of identification options. Bitmasks can be generated at the highest layer that still does error detection and/or error correction, with error detection and/or error correction provided by lower layers being deactivated, or bitmasks can be generated at the lowest layer based upon data passed down from higher layers.

Although not required, the description below will be in the general context of computer-executable instructions, such as program modules, being executed by a computing device. More specifically, the description will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional personal computers, and include other computing configurations, including servers, hand-held devices, multi-processor systems, microprocessor based or programmable consumer electronics, network PCs, minicomputers, mainframe computers, and the like. Similarly, the computing devices need not be limited to stand-alone computing devices, as the mechanisms may also be practiced in distributed computing environments where tasks are performed by remote processing devices that are linked through a communications network. In a distributed computing environment, program modules may be located in both local and remote memory storage devices.

With reference to FIG. 1, an exemplary system 100 is illustrated, providing context for the descriptions below. The exemplary system 100 comprises an exemplary transmitting computing device 110 and an exemplary receiving computing device 120, communicationally coupled to each other via the exemplary network 190. For purposes of the descriptions provided below, the network 190 can be a packetized communication network, whereby digital data is communicated across the network 190 in the form of discrete, individual packets of data transmitted, such as from the exemplary transmitting computing device 110, to the exemplary receiving computing device 120.

FIG. 1 illustrates an exemplary sequence of packets 130 comprising an exemplary packet 140, being transmitted from the exemplary transmitting computing device 110 to the exemplary receiving computing device 120. Typically, a packet, such as the exemplary packet 140, can comprise an error detection code, such as the exemplary error detection code 150. Such an error detection code can be utilized to detect transmission errors in the packet 140. More specifically, upon receipt of the exemplary packet 140, such as by the exemplary receiving computing device 120, the receiving computing device 120 can independently derive an error detection code from the data of the packet 140. If the error detection code derived by the receiving computing device 120, based upon the data of the packet 140 as received by the receiving computing device 120, differs from the error detection code 150 that was received, as part of the packet 140, by the receiving computing device 120, determination can be made that the digital data of the packet 140 was improperly received by the receiving computing device 120, and appropriate steps can be taken by the receiving computing device 120, such as discarding the received packet 140.

If a packet, such as the exemplary packet 140, is discarded by the receiving computing device 120, processes executing on the receiving computing device 120 can request the retransmission of the packet 140 from the transmitting computing device 110 to the receiving computing device 120, decreasing the overall throughput of data from the transmitting computing device 110 to the receiving computing device 120 across the network 190. To avoid such a decrease in throughput, packets can be transmitted without an error detection code, such as the exemplary error detection code 150, or, the receiving computing device 120 can not perform a check of a received packet, such as the packet 140, utilizing the error detection code 150. In such an instance, however, any portion of the packet 140 may have been transmitted or received with incorrect data.

In some instances, certain portions of digital data transmitted between the computing devices 110 and 120, across the network 190, may be sufficiently important to justify retransmission if such digital data is transmitted or received incorrectly, while other portions of digital data transmitted between the computing devices 110 and 120 may not be so important, such that the receipt of incorrect data may not be detrimental enough to justify incurring the inefficiency and loss of throughput inherent in requesting retransmissions of packets. For example, the transmission of numerical values can seek to prevent transmission errors in bits having higher numerical significance, while being agnostic to transmission errors in bits having lower numerical significance. As a specific example, a system, such as the exemplary system 100, may need to transmit the value two hundred, twenty-seven from the transmitting computing device 110 to the receiving computing device 120. The precision required may be such that if the receiving computing device receives a value of, for example, two hundred, thirty-one, or two hundred, twenty-four, such values may be "close enough" and the difference between the received value, such as, for example, two hundred, thirty-one, and the transmitted value, such as, for example, two hundred, twenty-seven, may not be sufficiently detrimental to the processes being executed across the exemplary system 100 to justify the additional expense and inefficiency of retransmitting a packet for such a small error. Conversely, receiving a value of, for example, ninety-nine, instead of the transmitted value of two hundred, twenty-seven may be sufficiently detrimental to justify the additional expense and inefficiency of discarding such an incorrect packet and requesting retransmission. Digitally, the value two hundred, twenty-seven can be expressed as the eight-bit number 11100011. Should one of the least significant bits be flipped during transmission, due to a transmission error, the transmitted bits could indeed have been 11100011, while the received bits could end up being 11100111, with the third least significant bit being flipped, due to the transmission error, from a binary value of "zero" to a binary value of "one". The result of such a bit flip can be that the value two hundred, twenty-seven was transmitted, but the value two hundred, thirty-one was received. As indicated previously, such a difference may not be sufficiently detrimental to justify the additional expense and inefficiency of discarding the received packet. Conversely, if one of the most significant bits was flipped during transmission, then, for example, the transmitted bits could indeed have been 11100011, while the received bits could end up being 01100011, with the most significant bit being flipped, due to the transmission error, from a binary value of "one" to a binary value of "zero". The result of such a bit flip can be that the value two hundred, twenty-seven was transmitted, but the value ninety-nine was received. As indicated previously, such a difference can be significant, and a packet carrying of value of ninety-nine should be detected as containing a transmission error and be discarded, instead of such a significantly different value being utilized and detrimentally impacting subsequent operations.

According to one aspect, a bitmask can identify portions of a packet that are to be protected by error detection and/or error correction schemes, portions of the packet that are to be excluded from such error detection and/or error correction schemes, or combinations thereof. As a simple example, a bitmask could be utilized in the above example to specify that the four most significant bits be protected by error detection and/or error correction schemes, while the four least significant bits be excluded from such error detection and/or error correction schemes. For example, a bitmask could specify that an error detection code be generated based only on the four most significant bits, to the exclusion of the four least significant bits. In such an example, if the eight-bit binary value 11100011 is transmitted, but the eight-bit binary value 01100011 is received, then, upon generating an error detection code utilizing the received four most significant bits, namely 0110, and comparing such a generated error detection code to the error detection code transmitted with the packet, which was generated utilizing the transmitted four most significant bits, namely 1110, the comparison will reveal a difference, and the packet can be discarded. In such a manner, the transmission of the value two hundred, twenty-seven, and the receipt of a meaningfully different value, such as ninety-nine, can be detected and dealt with. By contrast, if the eight-bit binary value 11100011 is transmitted, but the eight-bit binary value 11100111 is received, then, upon generating an error detection code utilizing the received four most significant bits, namely 1110, and comparing such a generated error detection code to the error detection code transmitted with the packet, which was generated utilizing the transmitted four most significant bits, also 1110, the comparison will reveal that there is no difference, and the packet can be retained. Because such a comparison is based only on the four most significant bits, it will not detect the difference in the third least significant bit between the transmitted and received binary values. In such a manner, the transmission of the value two hundred, twenty-seven, and the receipt of a different value, such as two hundred, thirty-one, which is not meaningfully different for the processes in the present example, can avoid incurring inefficiency and decrease in throughput by requesting retransmission of such a packet in camp, instead, utilizing the different, but not meaningfully different, received value.

Turning back to FIG. 1, the exemplary packet 140 can be divided into portions 141, 142, 143, 144 and 145. A bitmask, not illustrated, can identify specific portions, such as the exemplary portions 142 and 144, on which an error detection code, such as the exemplary error detection code 150, can be generated. The exclusion of portions 141, 143 and 145 from the generation of the error detection code 150 can result in transmission errors occurring within the digital data of those portions remaining undetected, with no retransmission being requested, and no decrease in throughput or network communication of efficiency being experienced. Returning to the simple example above, the section 142, for example, could comprise the most significant four bits of an eight-bit binary value, such as those utilized in the simple example above, while, continuing with such an example, the section 143 could comprise the least significant four bits of that same eight-bit binary value.

Figure 2:
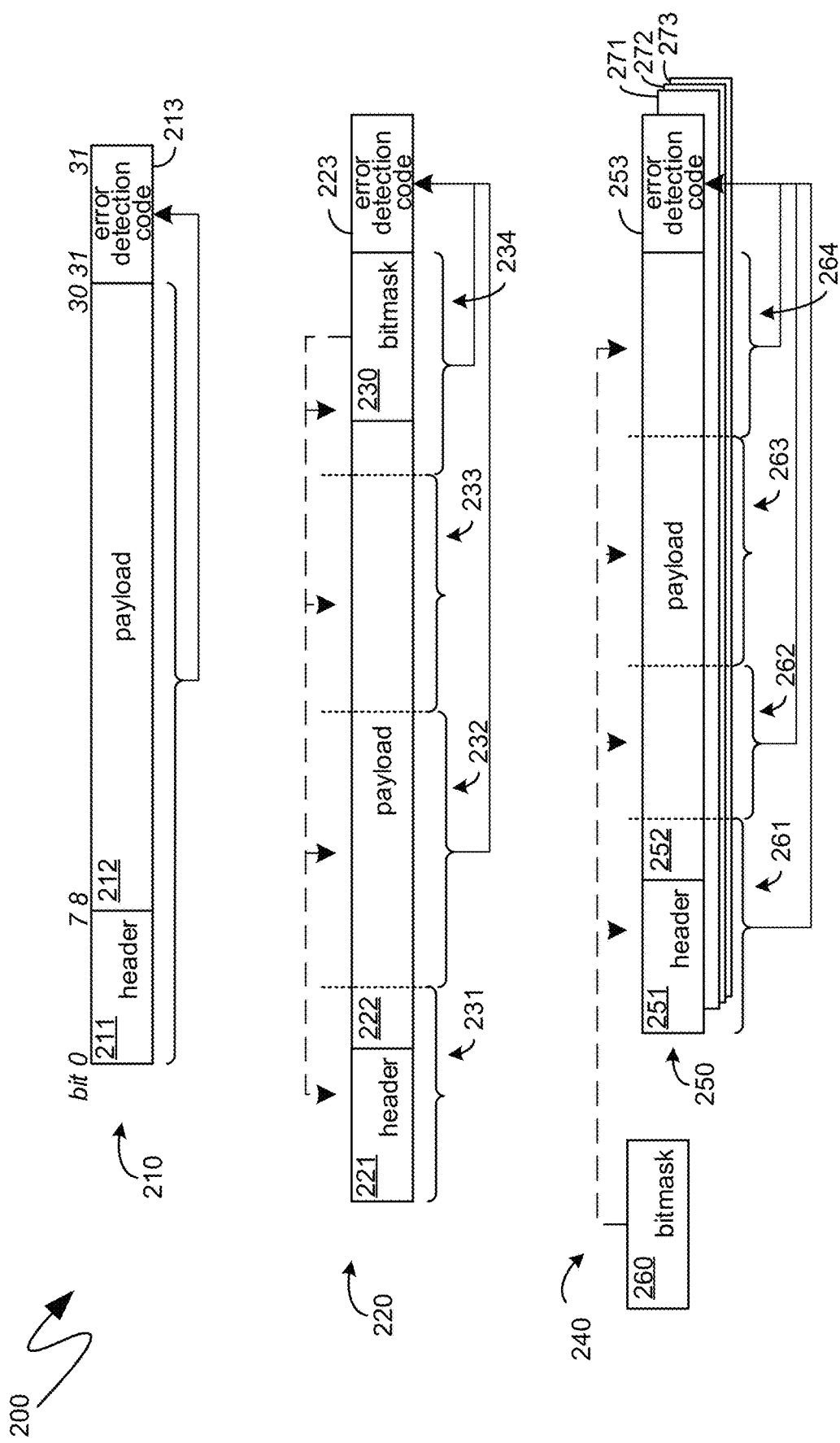
FIG. 2 is a system diagram of exemplary packets utilizing masked packet checksums.

Turning to FIG. 2, the system 200 shown therein illustrates exemplary packets 210, 220 and 250. Exemplary packet 210 can be a typical packet where the error detection code 213 can be based on the digital data contained in all the rest of the exemplary packet 210 including, for example, the exemplary header 211 and the exemplary payload 212. For purposes of illustration, the packets shown in the Figures of the present application are illustrated analogously to that of the exemplary packet 210, with rectangular sections being indicative of sequences of contiguous bits of digital data, arranged in a left-to-right manner. Thus, for example, the exemplary packet 210 is illustrated as comprising an exemplary header 211 comprising eight bits of data, an exemplary payload 212 comprising twenty-three bits of data, and an exemplary error detection code 213 comprising a single bit of data.

An error detection code, such as the exemplary error detection code 213, can be generated in accordance with any known error detection mechanism, including parity checking, Cyclical Redundancy Check (CRC), checksumming, or other like error detection mechanisms. For example, an error detection code based on parity checking can be a single bit that indicates whether the data, on which such a parity check bit was generated, is even or odd, such that if a single bit is changed during transmission a different parity check bit will be generated as a result and the error will be detected. As another example, CRC is based on binary division of the data on which the error detection code is based, the remainder of which is the CRC error detection code. As utilized herein, the term "error detection code" means any one or more bits of data generated to detect errors in the transmission of other data. Such other data is sent to be "protected" by the error detection code, since errors in the transmission of such data can be detected based on the error detection code. As utilized herein, the term "error correction code" means any one or more bits of data generated to correct errors in the transmission of other data, such that, if the other data is transmitted with errors, the original, error-free data can be reconstructed from the received data (with errors), in combination with the error correction code. Known error correction mechanisms include redundancy and Hamming codes.

In the exemplary system 200 of FIG. 2, the exemplary packet 210 comprises an error detection code generated based on all of the remaining data of the packet. By contrast, the exemplary packet 220 comprises an error detection code, such as the exemplary error detection code 223, which can be based only on specified portions of the exemplary packet 220. For example, the exemplary packet 220 can comprise an exemplary header 221, an exemplary payload 222, and an exemplary error detection code 223. In addition, the exemplary packet 220 can comprise a bitmask, such as the exemplary bitmask 230. The bitmask can specify which portions of the packet are utilized to generate the error detection code and, thereby, are protected by the error detection code in the sense that transmission errors occurring within those portions of the packet can be detected by reference to the error detection code, while transmission errors occurring outside of those portions of the packet cannot be detected, and, consequently will not trigger the retransmission of the packet, or otherwise decrease the efficiency and throughput of the network communications.

According to one aspect, a bitmask, such as the exemplary bitmask 230, can comprise a sequence of digital bits of data, each indicating whether or not a corresponding portion of the exemplary packet 220 is to be utilized in the generation of the exemplary error detection code 223. For example, if the exemplary packet 220 is divided into the exemplary sections 231, 232, 233 and 234, the exemplary bitmask 230 can comprise four bits of data, with each bit indicating whether or not a corresponding section is to be utilized in generation of the exemplary error detection code 223. For example, the exemplary bitmask 230 can be a sequence of four bits: 0101, indicating that sections 232 and 234 are to be utilized in the generation of the exemplary error detection code 223, such as is illustrated by the arrows in FIG. 2. The dashed arrows are meant to be illustrative of the presence of an explicit indication, either positive or negative, in the exemplary bitmask 230 indicating whether or not a corresponding section of the exemplary packet 220 is included in the generation of the error detection code 223. Such an explicit indication can be a single bit, or can be multiple bits of data providing additional, per-section detail for the section of the packet to which such an indication corresponds.

Figure 3:
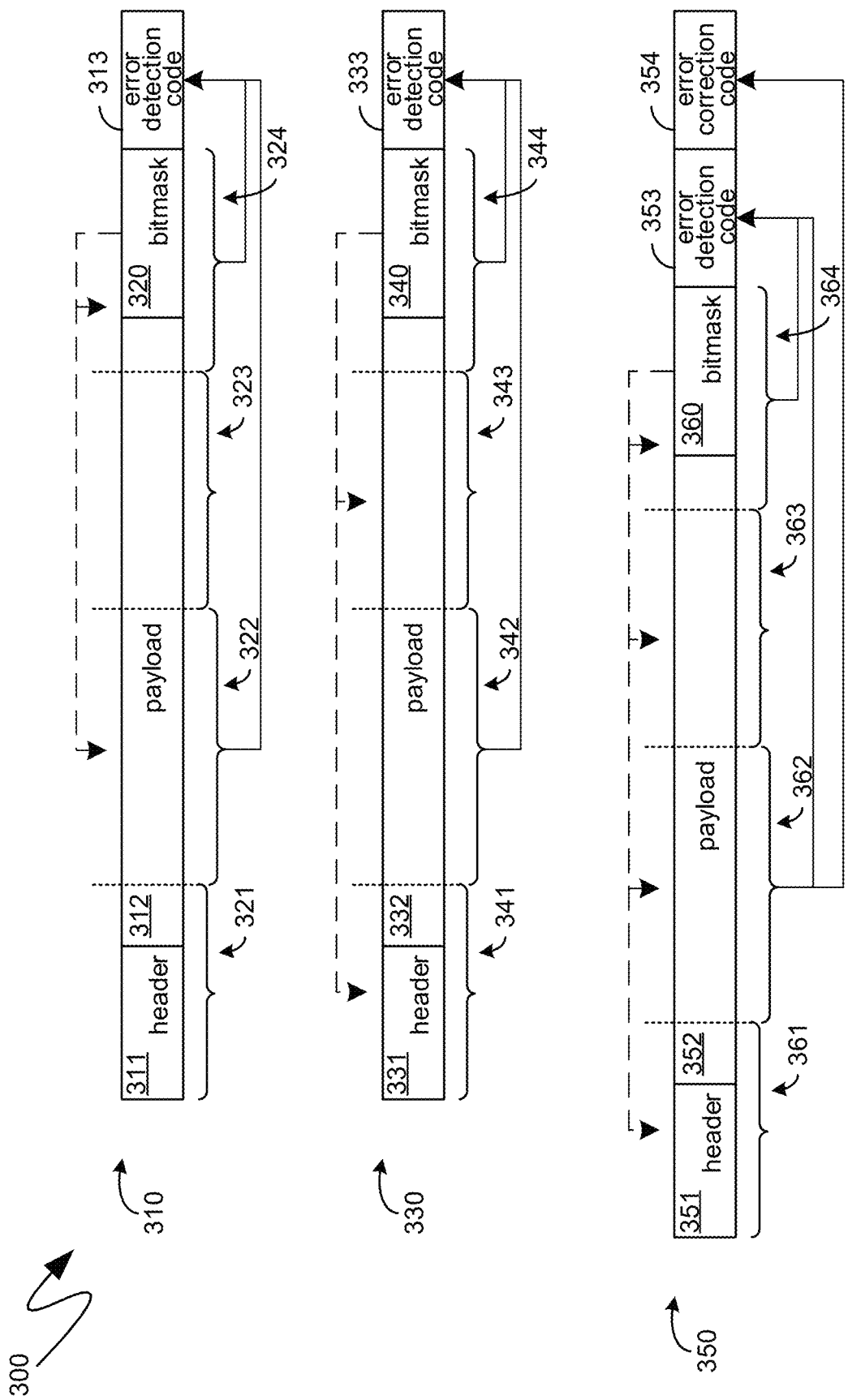
FIG. 3 is a system diagram of additional exemplary packets utilizing masked packet checksums.

Alternatively, bitmasks can identify only the sections of the packet that are to be utilized in the generation of an error detection code, with the absence of an indication of a section of a packet in the bitmask being an indicator that that section is not to be included in the generation of the error detection code. For example, turning to FIG. 3, the exemplary packet 310, shown therein, comprises an exemplary header 311, an exemplary payload 312, and an exemplary error detection code 313. An exemplary bitmask 320, which can be part of the exemplary packet 310, can comprise indicators of only those sections of the exemplary packet 310, such as the exemplary sections 322 and 324, that are to be utilized in the generation of the exemplary error detection code 313. The absence of any indication of sections 321 and 323, in the exemplary bitmask 320, can be an implicit indication that the exemplary sections 321 and 323 are not to be utilized in the generation of the error detection code 313. Thus, as illustrated in FIG. 3 with the dashed arrows, the exemplary bitmask 320 can comprise only explicit indications that the exemplary sections 322 and 324 are to be utilized in the generation of the exemplary error detection code 313, as illustrated by the non-dashed arrows.

As yet another alternative, bitmasks can identify only the sections of the packet that are not to be utilized in the generation of an error detection code, with the absence of an indication of a section of a packet in the bitmask being an indicator that that section is to be included in the generation of the error detection code. For example, the exemplary packet 330, shown in FIG. 3, comprises an exemplary header 331, an exemplary payload 332, and an exemplary error detection code 333. An exemplary bitmask 340, which can be part of the exemplary packet 330, can comprise indicators of only those sections of the exemplary packet 330, such as the exemplary sections 341 and 343, that are not to be utilized in the generation of the exemplary error detection code 313. The absence of any indication of sections 342 and 344, in the exemplary bitmask 340, can be an implicit indication that the exemplary sections 342 and 344 are to be utilized in the generation of the error detection code 333. Thus, as illustrated in FIG. 3 with the dashed arrows, the exemplary bitmask 320 can comprise only explicit indications that the exemplary sections 341 and 343 are not to be utilized in the generation of the exemplary error detection code 333. Thus, as further illustrated by the non-dashed arrows, the exemplary sections 342 and 344 can be utilized in the generation of the exemplary error detection code 333.

Turning back to FIG. 2, the exemplary sections 231, 232, 233 and 234 of the exemplary packet 220 can be divided in many different ways, and the specification thereof can be identified, recorded and/or communicated in many different ways. For example, each of the sections 231, 232, 233 and 234 can be an equal quantity of bits in size, or they can be individually sized such that the quantity of bits in one of the sections 231, 232, 233 or 234 can be different than the quantity of bits in any one or more others of the sections 231, 232, 233 or 234. The specification and/or delineation of the sections 231, 232, 233 and 234 can be part of a bitmask, such as the exemplary bitmask 230. Alternatively, a quantity of bits in each section can be predetermined, or can be a set amount. For example, the bits of the packet can be divided into thirty-two-bit segments, with indicators in the bitmask, such as the exemplary bitmask 230, being understood to correspond to sequential segments in the same order as the indicators. For example, the exemplary bitmask 230 can comprise the binary digital value 0101, with the first digital bit ("zero") being understood to correspond to the first thirty-two bits of the exemplary packet 220, such as can be represented by the exemplary section 231, the second digital bit ("one") being understood to correspond to the second thirty-two bits of the exemplary packet 220, such as can be represented by the exemplary section 232, the third digital bit ("zero") being understood to correspond to the third thirty-two bits of the exemplary packet 220, such as can be represented by the exemplary section 233, and the fourth digital bit ("zero") being understood to correspond to the fourth thirty-two bits of the exemplary packet 220, such as can be represented by the exemplary section 234. As yet another alternative, the delineation of sections of packets, such as the exemplary sections 231, 232, 233 and 234 can be part of the exemplary packet 220 itself. For example, data within the packet can indicate the end of a preceding section, and the start of a subsequent section. As yet another alternative, the delineation of sections of packets, such as the exemplary sections 231, 232, 233 and 234 can be independent of an individual packet, such as the exemplary packet 220. For example, the delineation of sections of packets can be transmitted separately from any one packet, can be agreed to in advance, or other like explicit or implicit delineation mechanisms can be utilized.

While illustrated as crossing the boundaries of established portions of a packet, such as a header portion, a payload portion, and so on, delineations of sections of packets can be based on such boundaries. For example, a first delineated section can comprise only the header of a packet. As another example, delineated sections can be delineated based upon a start or end of a payload section. Other delineations or identifications of sections of packets can likewise be utilized.

According to one aspect, a bitmask, such as the exemplary bitmask 230, can be transmitted independently of any one or more packets to which such a bitmask can apply. For example, as illustrated by the exemplary system 240, a bitmask 260 can apply to multiple packets, such as the exemplary packets 250, 271, 272 and 273. The exemplary packets 250, 271, 272 and 273 can be identified as corresponding to the bitmask 260 in various different ways. For example, the bitmask 260 can identify a sending application, or other source of data to be packetized, or source of packets of data, and can apply to all packets originating from such a source. As another example an identification of a stream, flow, communication channel, port, message identifiers, or other like identifications of one or more packets to which the bitmask 260 will apply can likewise be utilized. Alternatively, or in addition, each packet, such as the exemplary packets 250, 271, 272 and 273 can individually comprise identifications or correlations indicating that the error detection codes of such exemplary packets, such as the exemplary error detection code 253 of the exemplary packet 250, were generated in accordance with the information of the bitmask 260, mainly indicating which sections, such as the exemplary sections 261, 262, 263 and 264 were utilized to generate the error detection code.

Rather than being transmitted independently, a bitmask, such as the exemplary bitmask 260, can be independently derived by both the transmitting and receiving computing devices. For example, commonly utilized bitmasks can be agreed upon in advance, and an identification of a particular bitmask can be exchanged between the computing devices. Similarly, commonly utilized bitmasks can be exchanged in advance, and reference to such bitmasks can be included in individual packets in place of the explicit indicators of sections that was detailed above. Thus, for example, the exemplary bitmask 230, rather than a sequence of bits as detailed above, can, instead, comprise an identification of a previously agreed-upon bitmask, which can be identified utilizing less digital data than a bitmask itself. As a simple example, if only two bitmasks are utilized, with one bitmask specifying that only segments 232 and 234 are to be utilized when generating the exemplary error detection code 223, with such a bitmask being in the form of the binary digits 0101, as detailed above, and another bitmask specifying that only segments 231 and 233 are to be utilized when generating the exemplary error detection code 223, with such a bitmask being in the form of the binary digits 1010, then, instead of the packet specifying all four binary digits, a code could be utilized referencing previously agreed-upon masks, with a code of a binary value of "zero" representing the first bitmask, and a code of the binary value of "one" representing the other bitmask, thereby saving space within each individual packet.

Turning back to FIG. 3, while reference above has been made to an error detection code, the descriptions are equally applicable to error correction codes. More specifically, bitmasks can be utilized to specify which segments, or portions, of a packet are protected by an error correction code that can allow the originally transmitted data, within those portions, to be reconstructed should transmission errors occur. According to one aspect, a bitmask can comprise identifications of segments of a packet to be included in an error detection code, and can further separately comprise identifications of segments of a packet to be included in an error correction code. For example, the exemplary packet 350 illustrates an exemplary bitmask 360 that can identify which of the segments 361, 362, 363 and 364 are utilized in the generation of the error detection code 353, with the exemplary bitmask 360 further identifying which of the segments 361, 362, 363 and 364 are utilized in the generation of the error correction code 354. For example, as illustrated, the exemplary bitmask 360 can identify the segments 362 and 364 to be utilized in the generation of the error detection code 353, but can identify only the segment 362 to be utilized in the generation of the error correction code 354. In such an instance, while a transmission error can be detected if it occurs within the segments 362 or 364, only transmission errors within the segment 362 can be corrected without requiring retransmission. One mechanism by which a bitmask, such as the exemplary bitmask 360, can identify which sections are to be utilized in the generation of an error detection code and separately identify which sections are to be utilized in the generation of an error correction code, can be to comprise two bits for each section, with one bit indicating whether the section is to be utilized in generation of an error detection code, and the second bit indicating whether the section is to be utilized the generation of an error correction code. Thus, for example, the exemplary bitmask 360 could comprise a sequence of digital bits in the form of 00110010, with the first two digital bits identifying whether the corresponding section 361 is to be utilized in the generation of the error detection code 353, and in the generation of the error correction code 354, respectively, the next two digital bits identifying whether the corresponding section 362 is to be utilized in the generation of the error detection code 353, and in the generation of the error correction code 354, and so on.

According to one aspect, to be utilized with existing networking hardware and software, such as network interface card drivers, existing error detection mechanisms can be deactivated at such lower levels of software and/or networking hardware, and the above described mechanisms can be utilized to perform error detection and/or correction at higher levels. As utilized herein, the term "higher levels" or "lower levels" is made with reference to common layered network communication models, such as the well-known OSI model, but does not refer to any specific level of a specific model.

Figure 4:
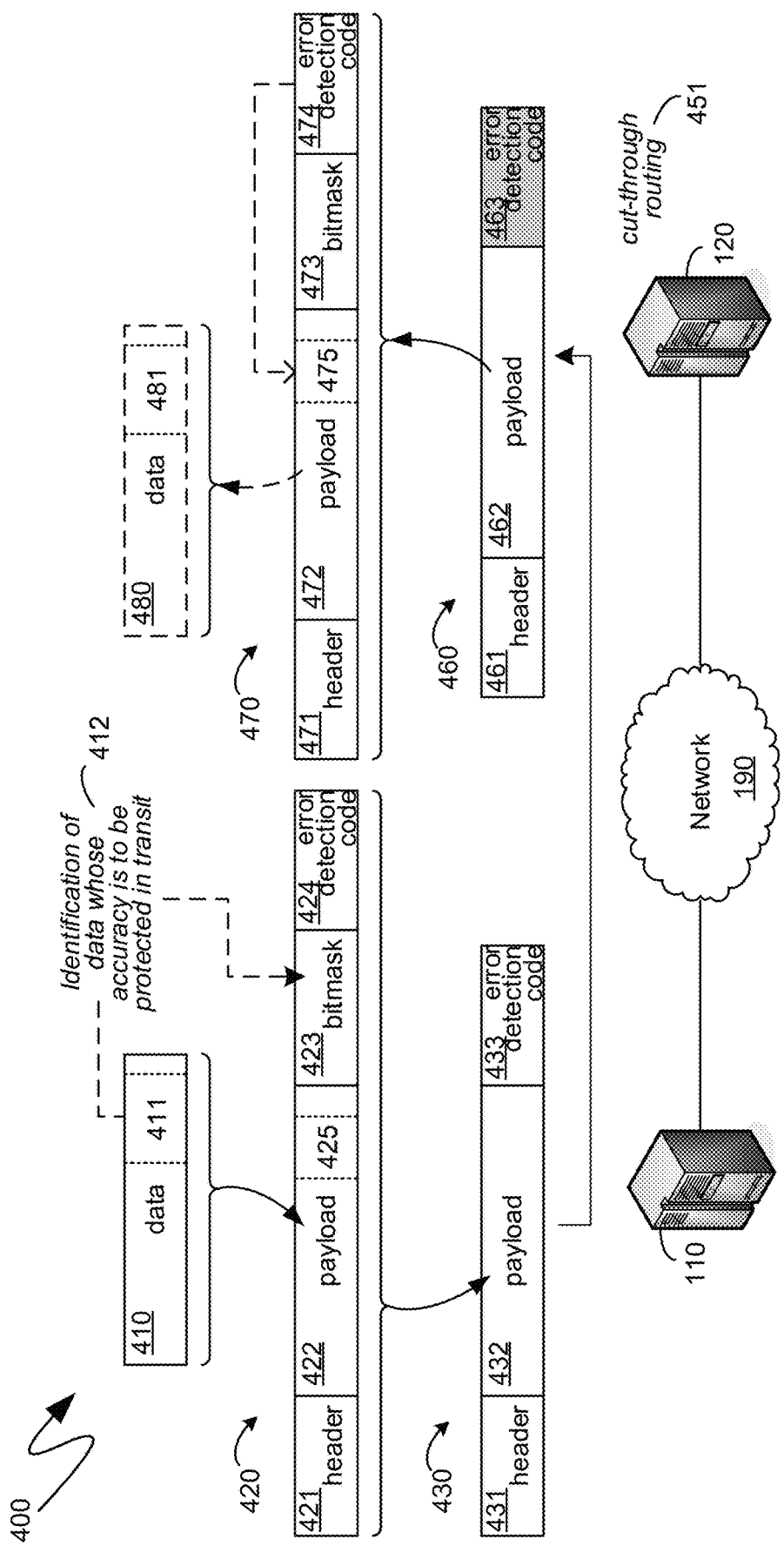
FIG. 4 is a system diagram of an exemplary transmission and receipt of packets utilizing masked packet checksums.

Turning to FIG. 4, the exemplary system 400 shown therein illustrates the transmission of data from a transmitting computing device 110 to receiving computing device 120 utilizing the tunable error detection mechanisms detailed above. Initially, a higher-level application, such as an application executing on the exemplary transmitting computing device 110, can generate data, such as the exemplary data 410, only a portion of which, such as the exemplary portion 411, may require that its accuracy be protected in transit. For example, returning to the simple example provided above, the data 410 can comprise an eight-bit binary value, with the most significant four bits being the portion 411 whose accuracy is to be protected in transit, while the remainder of the data 410, namely the least significant four bits, not requiring such accuracy protection, or error detection.

According to one aspect, an identification 412 of the portion 411 can be provided, together with the data 410, to lower level processes, such as network transmission processes. Such processes can packetize the data, such as into the exemplary packet 420. In the simplistic illustration shown in FIG. 4, the exemplary data 410 can be part of the exemplary payload 422 of the exemplary packet 420, which can further comprise an exemplary header 421, an exemplary bitmask 423, and an exemplary error detection code 424. The lower-level processes can utilize the identification 412 to determine an appropriate bitmask, such as the exemplary bitmask 423, which can identify an appropriate portion of the payload 422, such as the exemplary portion 425, corresponding to the data 411 whose accuracy is to be protected in transit, as the portion that is to be utilized in the generation of the exemplary error detection code 424. The exemplary bitmask 423 can identify the exemplary portion 425 in accordance with the mechanisms detailed above. The exemplary error detection code 424 can then be generated based on the exemplary portion 425, as also detailed above.

Subsequently, the exemplary packet 420 can be provided to a transmission layer, which can further packetize the packet 420, such as by generating a packet, such as the exemplary packet 430, comprising, as its payload 432, the packet 420. In addition, the exemplary packet 430 can comprise a header 431 and an error detection code 433 in accordance with known error detection code generation mechanisms. The exemplary packet 430 can then be transmitted from the transmitting computing device 110 to the receiving computing device 120, over the network 190.

The receiving computing device 120 can receive a packet 460, corresponding to the packet 430, though possibly with transmission errors as detailed above. According to one aspect, the error detection code 433, of the transmitted packet 430, which can be received as the error detection code 463 of the received packet 460, can have been generated utilizing known mechanisms that do not provide for the tuning of error detection. Accordingly, comparing the received error detection code 463 to an independently generated error detection code, generated on the receiving computing device 120, can result in the entire packet 460 being discarded. Such an action could nullify the benefits of the tunable error detection detailed above, and provided by the error detection code 424, in combination with the bitmask 423. To prevent such nullification, and to enable the utilization of the above described tunable error detection mechanisms with existing networking hardware and software, the error detection provided by such existing networking hardware and software can be deactivated. For example, the receiving computing device 120 can utilize cut-through routing 451, such that received packets, such as the exemplary packet 460, are not error detected and/or corrected at the data link layer, but rather are, instead, passed to higher-level software processes. The error detection code 463, generated by known mechanisms, can be ignored and not utilized to check packets for errors, as illustrated by the grayed-out error detection code 463.

The payload 462 of the received packet 460 can be unpacked and the packet 470 can be provided to higher-level software processes. Such higher-level software processes can implement the tunable error detection mechanisms detailed above. For example, the exemplary bitmask 473 of the exemplary packet 470 can be referenced to identify which portions of the exemplary packet 470 are to be utilized to independently generate an error detection code that can be compared with the exemplary error detection code 474 received as part of the received packet 470. Based on the bitmask 473, an error detection code can be generated utilizing only the portion 475 of the packet 470, and a comparison of that generated error detection code can be made with the received error detection code 474. If the comparison reveals no differences, a determination can be made that no transmission errors occurred that impacted the data in the portion 475. The payload 472 of the received packet 470 can then be unpacked into the data 480 which can then be provided to a receiving application. The data 480 provided to the receiving application comprises a section 481 whose accuracy was protected in transit. Thus, the provision of the data 480 does not necessarily signify that all of the data 480 was received without transmission errors, but only that the data within the portion 481 was received without transmission errors. Returning again to the simple example provided above, if the portion 481 is the most significant four bits of an eight-bit number, then the value of the data 480 may be off a little bit from the value of the data 410, since errors may have been introduced into the least significant four bits with its transmission across the network 190, but such differences can be limited because the most significant four bits were received without error. By contrast, if the error detection code independently generated on the receiving computing device 120, utilizing the information from the bitmask 473, did not match the error detection code 474, it can be determined that the portion 475 was likely transmitted with errors and, accordingly, the received packet 470 can be dropped and retransmitted. The data 480 is illustrated in dashed lines to indicate that its provision to the receiving application is contingent upon a match in the error detection codes, as detailed herein. In such a manner, two applications can communicate data whose required accuracy can be utilized to tune a level of error detection, such that data requiring less accuracy can be transmitted with error detection being applied to only smaller portions of the packets, thereby resulting in fewer retransmissions due to transmission errors, and, thereby, higher throughput and greater efficiency, while data requiring greater accuracy can be transmitted with error detection being applied to greater portions of the packets, thereby potentially resulting in more retransmissions due to transmission errors and correspondingly lower throughput and less efficiency. Exemplary system 400 shown in FIG. 4 illustrates one mechanism by which such tunable error detection can be implemented with existing networking hardware and software.

Figure 5:
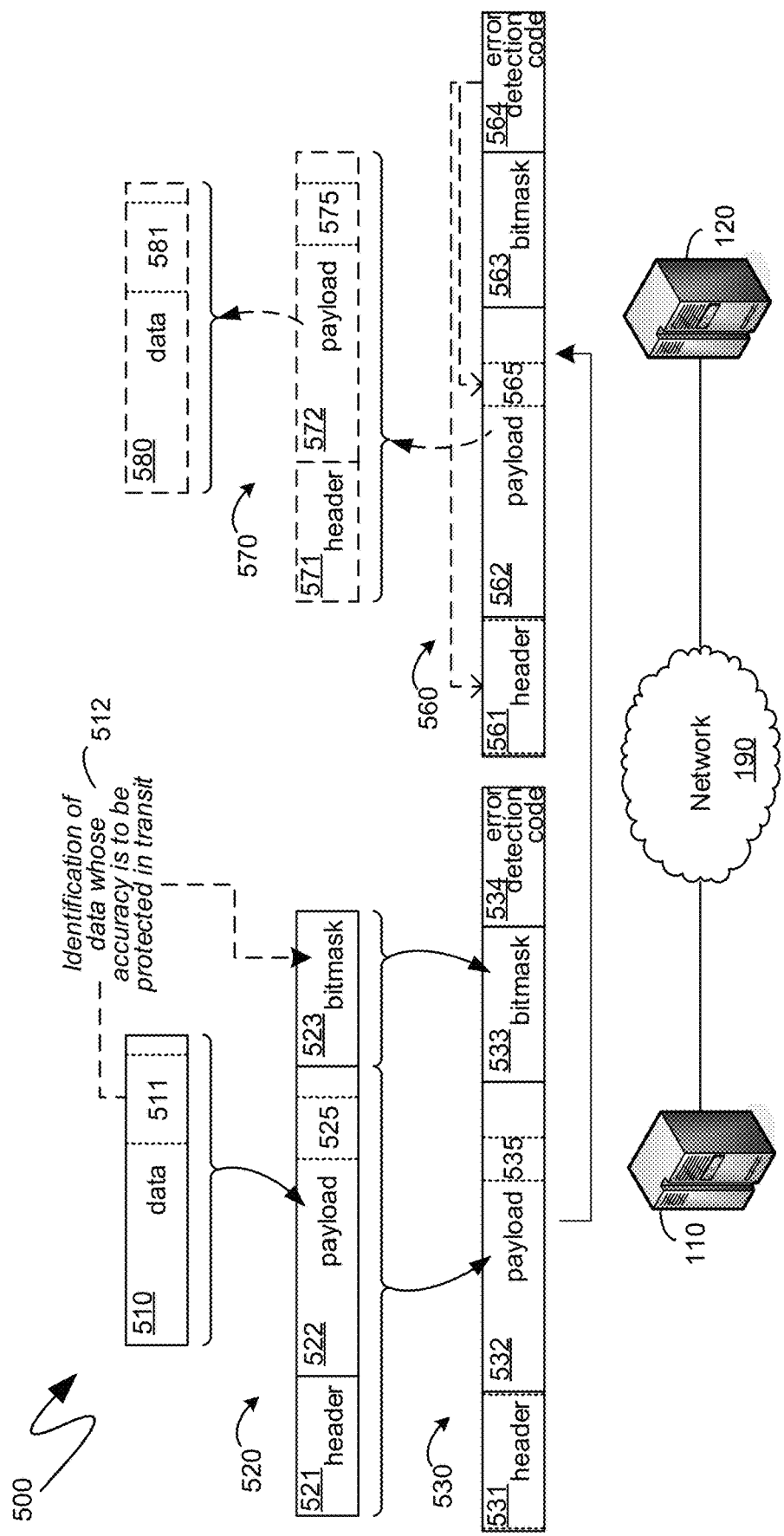
FIG. 5 is a system diagram of another exemplary transmission and receipt of packets utilizing masked packet checksums.

Turning to FIG. 5, the exemplary system 500 shown therein illustrates the transmission of data from a transmitting computing device 110 to receiving computing device 120 utilizing the tunable error detection mechanisms detailed above, such as they could be implemented in software and/or hardware, executing at lower layers of the network stack. More specifically, the exemplary system 500 again illustrates data being sent by an application executing on the transmitting computing device 110, namely the exemplary data 510, that can comprise data whose accuracy is to be protected in transit, such as the exemplary portion 511. Information identifying the portion 511, such as the exemplary identification 512, can be passed down to lower layers of a network stack, and can be utilized to generate a bitmask, such as the exemplary bitmask 523, in the manner detailed above. The exemplary bitmask 523 can be part of an exemplary packet 520, comprising a header 521, and a payload 522 into which the data 510 was packetized. The exemplary bitmask 523 can identify a portion of the packet 520, such as the exemplary portion 525, that is to be utilized to generate an error detection code, thereby protecting the accuracy of the portion 511, which can correspond to the portion 525 of the packet 520.

However, the generation of an error detection code can not be performed as part of the generation of the packet 520. Instead, according to one aspect, as the packet 520 is passed down the network stack, it can be incorporated into the payload of a successively lower level generated packet, such as in the manner shown in FIG. 5. For example, the exemplary packet 520 can be packetized into the payload 532 of a lower layer packet, such as the exemplary packet 530, which can also comprise a header 531, and a bitmask 533, specifying which portions of the exemplary packet 530 are to be utilized in generating the error detection code 534. According to one aspect, the information of the bitmask 523, of the packet 520, can be passed down, such as a parameter provided to a "generate packets" function call into such a lower layer. The information of the bitmask 523 can be incorporated into the bitmask 533 as part of the generation of the packet 530, which can also entail the packetization of the packet 520 into the payload 532, of the packet 530. For example, the exemplary bitmask 533 can comprise an indicator indicating that the portion 535, of the packet 530, is to be utilized in generating the error detection code 534 of the packet 530. As before, the portion 535 can correspond to the portion 525 of the packet 520, which can, in turn, correspond to the portion 511, as indicated previously, whose accuracy is to be protected in transmission.

According to one aspect, at the lowest layer, such as that represented by the packet 530, the bitmask 533 can include an identification of a portion of the packet 530 corresponding at least to the header 531. In such a manner, the error detection code 534, of the packet 530, can also protect the header information 531, such that transmission errors occurring within the header 531 can be detected. Portions of the exemplary packet 531 indicated by the exemplary bitmask 533 to be utilized in the generation of the exemplary error detection code 534 are illustrated in FIG. 5 via dashed lines.

The exemplary packet 530 can be transmitted from the transmitting computing device 110 to the receiving computing device 120 over the network 190, where it can be received as the received packet 560. The bitmask 563 can be utilized to determine which portions of the exemplary packet 560 are to be utilized when independently generating an error detection code to compare to the received error detection code 564. As before, such portions can be utilized to independently generate an error detection code, and compare such an independently generated error detection code to the received error detection code 564. If such a comparison reveals a difference between the two, then a transmission error can be determined to have occurred within one of the portions utilized to generate the error detection code, and the packet 560 can be discarded. A retransmission request can then be made, causing the transmitting computing device 110 to send the packet 530 to the receiving computing device 120 over the network 190 again. However, if the generated error detection code matches the received error detection code 564, the exemplary payload 562 can be extracted into, for example, the exemplary higher-level packet 570, comprising a header 571 and a payload 572. In turn, the exemplary higher-level packet 570 can be unpacked into the exemplary data 580, which can be provided to a receiving application. As before, any transmission errors within the portion of the data 581, corresponding to the portion 575 of the packet 570, corresponding to the portion 565, of the packet 560, can have been detected and, consequently, the accuracy of the data within the portion 581 can have been protected in transit.

Figure 6:
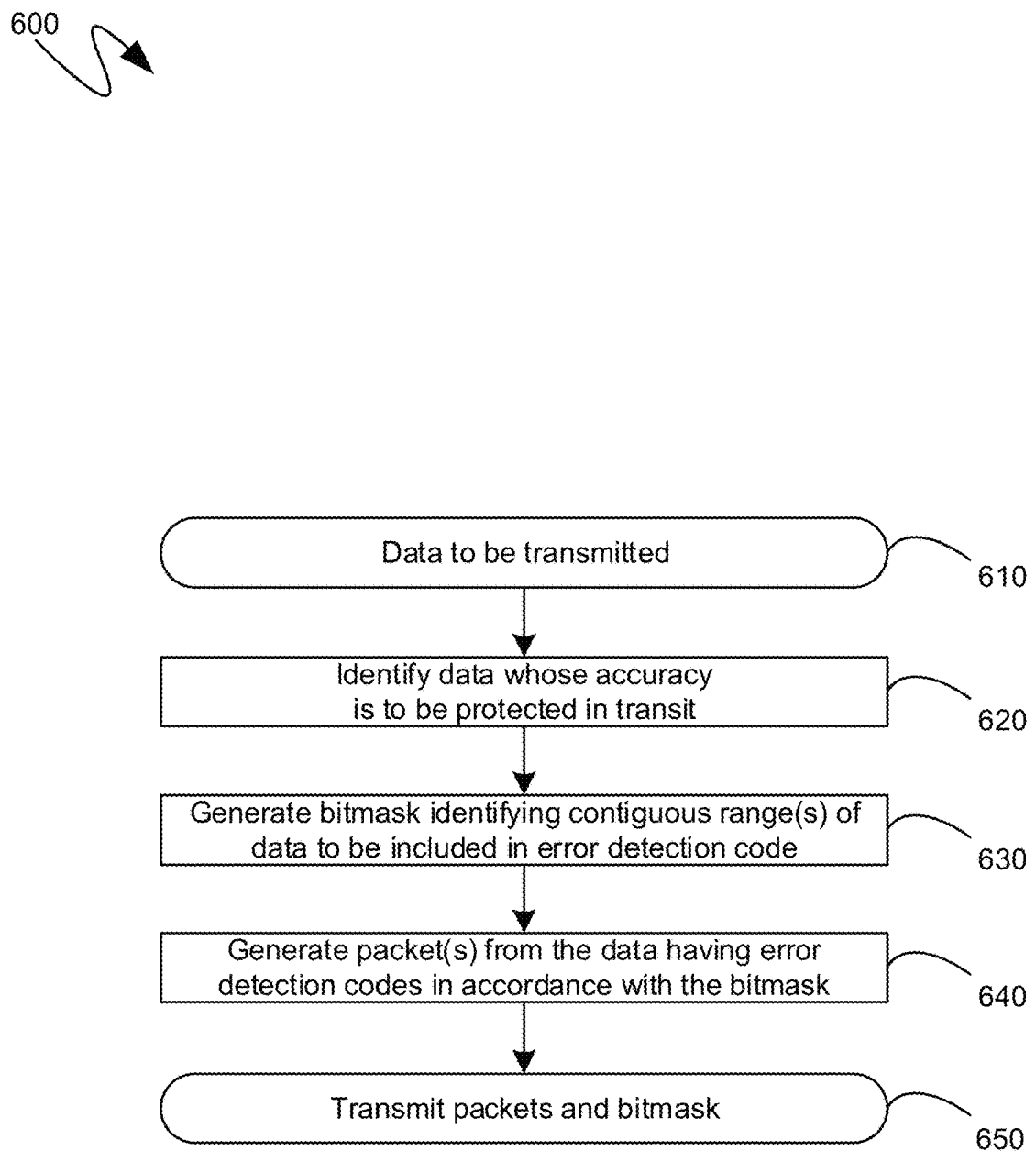
FIG. 6 is a flow diagram of an exemplary transmission of data utilizing masked packet checksums.

Turning to FIG. 6, the exemplary flow diagram 600 shown therein illustrates an exemplary series of steps that can be performed by a transmitting computing device. Initially, at step 610, data to be transmitted can be received for packetization and transmission. As part of the packetization of such data, an identification or determination of whether any specific portion of the data of step 610 requires that its accuracy be protected in transit can be determined at step 620. Subsequently, at step 630, a bitmask can be generated which can identify contiguous ranges of data within a packet comprising at least a portion of the data to be transmitted from step 610. As detailed above, the bitmask generated at step 630 can be in any of many different formats, including, for example, a sequence of digital bits with each one or more bits correlating to a portion of a packet, and indicating whether such a portion is to be included in the generation of an error detection code. At step 640, packets comprising at least portions of the data from step 610 can be generated. The generation of such packets, at step 640, can include the generation of error detection codes, which can be generated from the portions identified by the corresponding bitmask from step 630. The packets generated at step 640, and the bitmask generated at step 630, can be transmitted at step 650. As detailed previously, a bitmask can be transmitted as part of a packet, or can be transmitted separately, and can apply to one or more packets.

Figure 7:
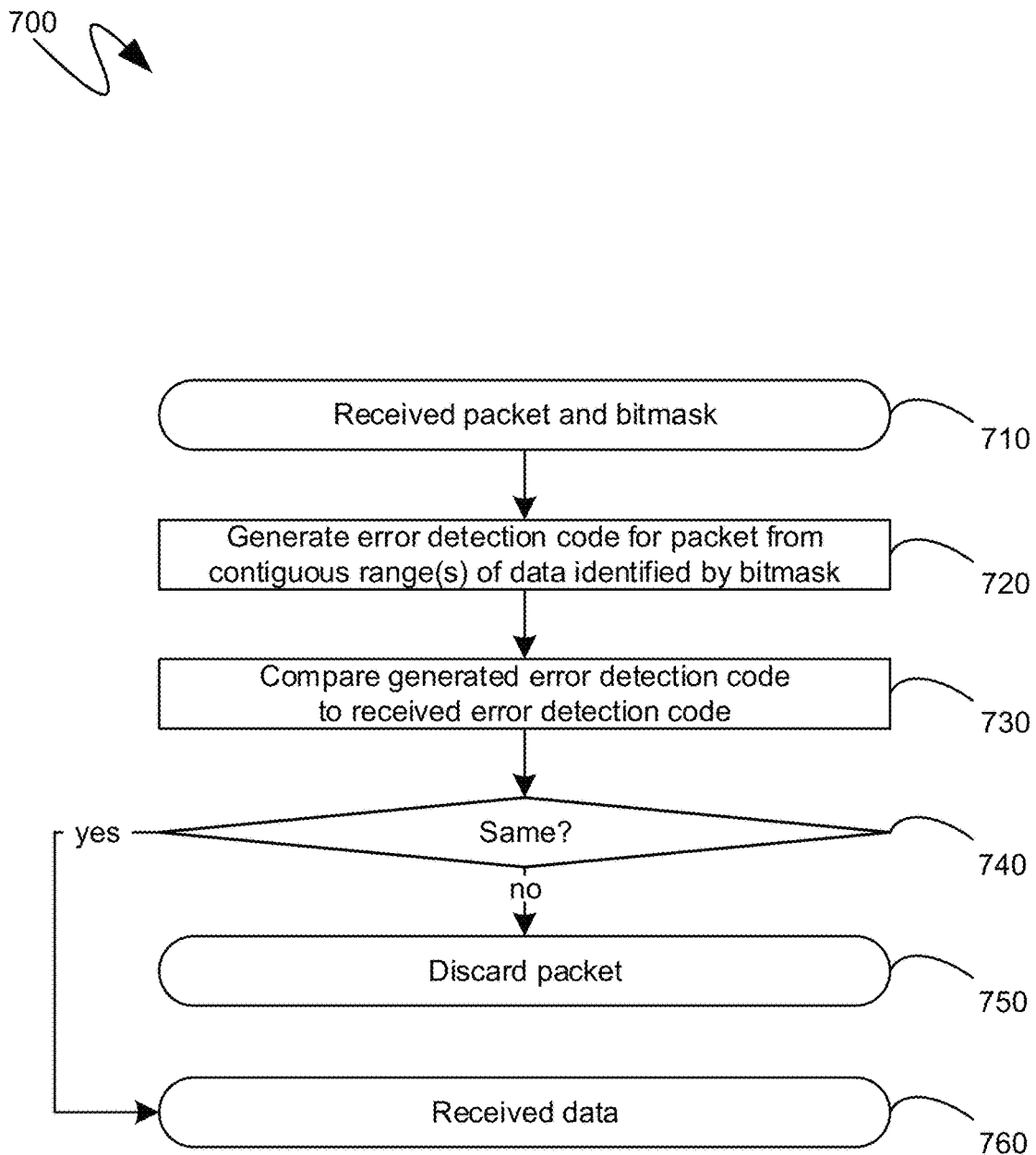
FIG. 7 is a flow diagram of an exemplary receipt of data utilizing masked packet checksums.

Turning to FIG. 7, the exemplary flow diagram 700 shown therein illustrates an exemplary series of steps that can be performed by a receiving computing device. Initially, at step 710, the receiving computing device can receive one or more packets and corresponding bitmasks. As before, such bitmasks can be included with the packets, can be transmitted separately, or can be independently derived based upon shared or transmitted information. At step 720, utilizing the data from a received packet, an error detection code for such a packet can be generated from the portions of the received packet that are identified by a bitmask corresponding to the packet. Subsequently, at step 730, the error detection code generated at step 720 can be compared to the error detection code that was received. If they are the same, as determined at step 740, processing can proceed to 760 and the received packet can be passed to higher layers of the networking stack of the receiving computing device. Conversely, if, at step 740, is determined that there is a difference between the error detection code generated at step 720 and the error detection code received with the packet, then the packet can be discarded, such as at step 750, and can be ultimately retransmitted, if appropriate. In such a manner, a tunable error detection can be utilized to increase network throughput and efficiency in situations where not all of the transmitted data is required to be transmitted without error.

Figure 8:
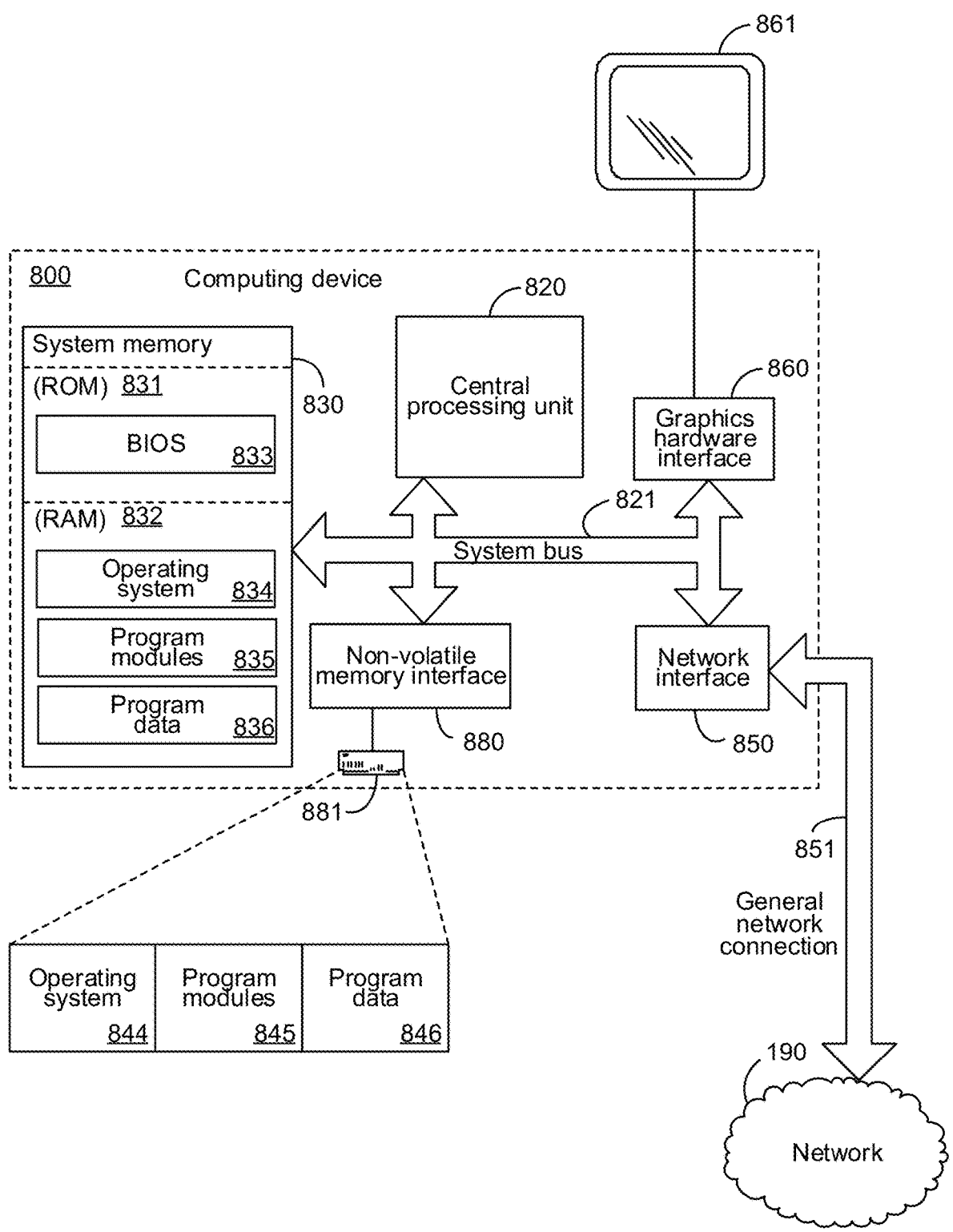
FIG. 8 is a block diagram of an exemplary computing device.

Turning to FIG. 8, an exemplary computing device 800 is illustrated which can perform some or all of the mechanisms and actions described above. The exemplary computing device 800 can include, but is not limited to, one or more central processing units (CPUs) 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. The computing device 800 can optionally include graphics hardware, including, but not limited to, a graphics hardware interface 860 and a display device 861, which can include display devices capable of receiving touch-based user input, such as a touch-sensitive, or multi-touch capable, display device. Depending on the specific physical implementation, one or more of the CPUs 820, the system memory 830 and other components of the computing device 800 can be physically co-located, such as on a single chip. In such a case, some or all of the system bus 821 can be nothing more than silicon pathways within a single chip structure and its illustration in FIG. 8 can be nothing more than notational convenience for the purpose of illustration.

The computing device 800 also typically includes computer readable media, which can include any available media that can be accessed by computing device 800 and includes both volatile and nonvolatile media and removable and non-removable media. By way of example, and not limitation, computer readable media may comprise computer storage media and communication media. Computer storage media includes media implemented in any method or technology for storage of content such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired content and which can be accessed by the computing device 800. Computer storage media, however, does not include communication media. Communication media typically embodies computer readable instructions, data structures, program modules or other data in a modulated data signal such as a carrier wave or other transport mechanism and includes any content delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer content between elements within computing device 800, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, other program modules 835, and program data 836.

The computing device 800 may also include other removable/non-removable, volatile/nonvolatile computer storage media. By way of example only, FIG. 8 illustrates a hard disk drive 841 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media as defined and delineated above. The hard disk drive 841 is typically connected to the system bus 821 through a non-volatile memory interface such as interface 840.

The drives and their associated computer storage media discussed above and illustrated in FIG. 8, provide storage of computer readable instructions, data structures, program modules and other data for the computing device 800. In FIG. 8, for example, hard disk drive 841 is illustrated as storing operating system 844, other program modules 845, and program data 846. Note that these components can either be the same as or different from operating system 834, other program modules 835 and program data 836. Operating system 844, other program modules 845 and program data 846 are given different numbers hereto illustrate that, at a minimum, they are different copies.

The computing device 800 may operate in a networked environment using logical connections to one or more remote computers. The computing device 800 is illustrated as being connected to the general network connection 851 (to the network 190) through a network interface or adapter 850, which is, in turn, connected to the system bus 821. In a networked environment, program modules depicted relative to the computing device 800, or portions or peripherals thereof, may be stored in the memory of one or more other computing devices that are communicatively coupled to the computing device 800 through the general network connection 861. It will be appreciated that the network connections shown are exemplary and other means of establishing a communications link between computing devices may be used.

Although described as a single physical device, the exemplary computing device 800 can be a virtual computing device, in which case the functionality of the above-described physical components, such as the CPU 820, the system memory 830, the network interface 840, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where the exemplary computing device 800 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. The term "computing device", therefore, as utilized herein, means either a physical computing device or a virtualized computing environment, including a virtual computing device, within which computer-executable instructions can be executed in a manner consistent with their execution by a physical computing device. Similarly, terms referring to physical components of the computing device, as utilized herein, mean either those physical components or virtualizations thereof performing the same or equivalent functions.

The descriptions above include, as a first example a system comprising: a transmitting computing device comprising: one or more transmitting computing device processing units; and one or more transmitting computing device storage media comprising computer-executable instructions, which, when executed by at least some of the transmitting computing device processing units, cause the transmitting computing device to: generate a first bitmask indicating that a first contiguous range of data of one or more packets associated with the first bitmask is to be included in the generation of a packet error detection code and that a second contiguous range of data of the one or more packets associated with the first bitmask is to be excluded from the generation of the packet error detection code, wherein each packet of the one or more packets associated with the first bitmask has a corresponding packet error detection code generated in accordance with the first bitmask; generate, for a first packet, a first packet error detection code based on data of the first packet that is within the first contiguous range of data, to the exclusion of data of the first packet that is within the second contiguous range of data, the first packet being one of the packets associated with the first bitmask; transmit the first bitmask, the first packet and the first packet error detection code; and a receiving computing device comprising: one or more receiving computing device processing units; and one or more receiving computing device storage media comprising computer-executable instructions, which, when executed by at least some of the receiving computing device processing units, cause the receiving computing device to: receive the first bitmask, the first packet and the first packet error detection code; generate another instance of the first packet error detection code based on data of the first packet, as received by the receiving computing device, that is within the first contiguous range of data, to the exclusion of data of the first packet, as received by the receiving computing device, that is within the second contiguous range of data; and discard the first packet from the receiving computing device if the generated instance of the first packet error detection code differs from the first packet error detection code as received by the receiving computing device; wherein the receiving computer will retain the first packet as correctly received even though there are differences between the first packet as transmitted by the transmitting computing device and the first packet as received by the receiving computing device, if the differences are within the second contiguous range of data.

A second example is the system of the first example, wherein the first bitmask comprises two data bits: a first data bit set to a first binary value, the first data bit corresponding to the first contiguous range of data, the first binary value being indicative of the inclusion of the first contiguous range of data in the generation of the packet error detection code; and a second data bit set to a second binary value differing from the first binary value, the second data bit corresponding to the second contiguous range of data, the second binary value being indicative of the exclusion of the second contiguous range of data from the generation of the packet error detection code.

A third example is the system of the first example, wherein the first contiguous range of data comprises a different quantity of data from the second contiguous range of data.

A fourth example is the system of the first example, wherein the first bitmask further indicates that a third contiguous range of data of the one or more packets associated with the first bitmask is to be included in the generation of the packet error detection code, the second contiguous range of data being between, and bounded by, the first and third contiguous ranges of data.

A fifth example is the system of the first example, wherein the contiguous ranges of data, indicated by the first bitmask as being either to be included in, or to be excluded from, the generation of the packet error detection code, comprise only a portion of the data of the one or more packets associated with the first bitmask.

A sixth example is the system of the first example, wherein the first packet comprises both the first bitmask and the first packet error detection code, the one or more packets associated with the first bitmask being only of the first packet.

A seventh example is the system of the first example, wherein the first bitmask is transmitted independently of the first packet and the first packet error detection code.

An eighth example is the system of the first example, wherein the one or more packets associated with the first bitmask are a sequence of packets transmitted after the first bitmask.

A ninth example is the system of the first example, wherein the transmitting the first bitmask and the receiving the first bitmask comprise exchanging information from which the transmitting computing device and the receiving computing device can independently derive the first bitmask.

A tenth example is the system of the first example, wherein the first error detection code is an error correction code.

An eleventh example is the system of the first example, wherein the first bitmask comprises a first set of bits indicating whether any of the first and second contiguous ranges of data are to be included in the generation of the packet error detection code and a second set of bits separately indicating whether any of the first and second contiguous ranges of data are to be included in the generation of a packet error correction code.

A twelfth example is the system of the first example, wherein the first bitmask comprises a code that corresponds to the indication that the first contiguous range of data is to be included in the generation of the packet error detection code and that the second contiguous range of data is to be excluded from the generation of the packet error detection code, the code and the corresponding indication being part of a dictionary of codes and corresponding indications that is accessible by both the transmitting and receiving computing devices.

A thirteenth example is the system of the first example, wherein the first bitmask indicates that the first contiguous range of data is to be included in the generation of the packet error detection code by omitting an identification of the first contiguous range of data, the first bitmask only identifying ranges of data that are be excluded from the generation of the packet error detection code.

A fourteenth example is the system of the first example, wherein the first bitmask indicates that the second contiguous range of data is to be excluded from the generation of the packet error detection code by comprising no identification of the second contiguous range of data, the first bitmask only identifying ranges of data that are be included in the generation of the packet error detection code.

A fifteenth example is the system of the first example, wherein the computer-executable instructions for transmitting the first bitmask, the first packet and the first packet error detection code comprise computer-executable instructions, which, when executed by at least some of the transmitting computing device processing units, cause the transmitting computing device to: encapsulate the first bitmask, the first packet and the first packet error detection code into a payload of a second packet; and transmit the second packet.

A sixteenth example is the system of the first example, wherein the one or more transmitting computing device storage media comprise further computer-executable instructions, which, when executed by at least some of the transmitting computing device processing units, cause the transmitting computing device to: receive a second packet associated with a second bitmask, the second bitmask indicating that a first contiguous range of data of the second packet is to be included in the generation of the packet error detection code and that a second contiguous range of data of the second packet is to be excluded from the generation of the packet error detection code; and encapsulate the second packet into a payload of the first packet; wherein the generating the first bitmask is based on the second bitmask.

A seventeenth example is the system of the sixteenth example, wherein the generating the first bitmask comprises: delineating the first contiguous range of data of the first packet, associated with the first bitmask, to correspond to the first contiguous range of data of the second packet, as encapsulated into the payload of the first packet; and delineating the second contiguous range of data of the first packet, associated with the first bitmask, to correspond to the second contiguous range of data of the second packet, as encapsulated into the payload of the first packet.

An eighteenth example is the system of the first example, wherein the receiving computing device implements cut-through routing to avoid error detection of received packets at a data link layer.

A nineteenth example is a method of generating a packet, for transmitting digital data across a network, where only a portion of a payload of the packet is protected against transmission errors, the method comprising: generating, at a transmitting computing device, a first bitmask indicating that a first contiguous range of data of one or more packets associated with the first bitmask is to be included in the generation of a packet error detection code and that a second contiguous range of data of the one or more packets associated with the first bitmask is to be excluded from the generation of the packet error detection code, wherein each packet of the one or more packets associated with the first bitmask has a corresponding packet error detection code generated in accordance with the first bitmask; generating, at the transmitting computing device, for a first packet, a first packet error detection code based on data of the first packet that is within the first contiguous range of data, to the exclusion of data of the first packet that is within the second contiguous range of data, the first packet being one of the packets associated with the first bitmask; and transmitting, from the transmitting computing device, the first bitmask, the first packet and the first packet error detection code across the network.

A twentieth example is a method of receiving a packet, transporting digital data across a network, where only a portion of a payload of the packet is checked for transmission errors, the method comprising: receiving, at a receiving computing device, a first bitmask, a first packet and a first packet error detection code, the first packet being associated with the first bitmask, the first bitmask indicating that a first contiguous range of data of the first packet was included in the generation of the first packet error detection code and that a second contiguous range of data of the first packet was excluded from the generation of the first packet error detection code; generating, at the receiving computing device, another instance of the first packet error detection code based on data of the received first packet that is within the first contiguous range of data, to the exclusion of data of the received first packet that is within the second contiguous range of data; and discarding, from the receiving computing device, the received first packet if the generated instance of the first packet error detection code differs from the received first packet error detection code; wherein the received first packet is retained as correctly received even though there are differences between the first packet as transmitted and the first packet as received, if the differences are within the second contiguous range of data.

As can be seen from the above descriptions, mechanisms for tuning error detection and/or error correction to apply only to identified, discrete portions of a packet, to the exclusion of other portions, have been presented. In view of the many possible variations of the subject matter described herein, we claim as our invention all such embodiments as may come within the scope of the following claims and equivalents thereto.

We claim:

1. A system comprising:
    a transmitting computing device comprising:
        one or more transmitting computing device processing units; and
        one or more transmitting computing device storage media comprising computer-executable instructions, which, when executed by at least some of the transmitting computing device processing units, cause the transmitting computing device to:
            generate a first bitmask indicating that a first contiguous range of data of one or more packets associated with the first bitmask is to be included in the generation of a packet error detection code and that a second contiguous range of data of the one or more packets associated with the first bitmask is to be excluded from the generation of the packet error detection code, the second contiguous range of data being closer to a beginning of the one or more packets associated with the first bitmask than the first contiguous range, wherein each packet of the one or more packets associated with the first bitmask has only a single corresponding packet error detection code generated in accordance with the first bitmask;
            generate, for a first packet, a first packet error detection code based on data of the first packet that is within the first contiguous range of data, to the exclusion of data of the first packet that is within the second contiguous range of data, the first packet being one of the packets associated with the first bitmask;
            transmit the first bitmask, the first packet and the first packet error detection code; and
    a receiving computing device comprising:
        one or more receiving computing device processing units; and
        one or more receiving computing device storage media comprising computer-executable instructions, which, when executed by at least some of the receiving computing device processing units, cause the receiving computing device to:
            receive the first bitmask, the first packet and the first packet error detection code;
            generate another instance of the first packet error detection code based on data of the first packet, as received by the receiving computing device, that is within the first contiguous range of data, to the exclusion of data of the first packet, as received by the receiving computing device, that is within the second contiguous range of data; and
            discard the first packet from the receiving computing device if the generated instance of the first packet error detection code differs from the first packet error detection code as received by the receiving computing device;
    wherein the receiving computer will retain the first packet as correctly received even though there are differences between the first packet as transmitted by the transmitting computing device and the first packet as received by the receiving computing device, if the differences are within the second contiguous range of data.

2. The system of claim 1, wherein the first bitmask comprises two data bits:
    a first data bit set to a first binary value, the first data bit corresponding to the first contiguous range of data, the first binary value being indicative of the inclusion of the first contiguous range of data in the generation of the packet error detection code; and
    a second data bit set to a second binary value differing from the first binary value, the second data bit corresponding to the second contiguous range of data, the second binary value being indicative of the exclusion of the second contiguous range of data from the generation of the packet error detection code.

3. The system of claim 1, wherein the first contiguous range of data comprises a different quantity of data from the second contiguous range of data.

4. The system of claim 1, wherein the first bitmask further indicates that a third contiguous range of data of the one or more packets associated with the first bitmask is to be included in the generation of the packet error detection code, the second contiguous range of data being between, and bounded by, the first and third contiguous ranges of data.

5. The system of claim 1, wherein the contiguous ranges of data, indicated by the first bitmask as being either to be included in, or to be excluded from, the generation of the packet error detection code, comprise only a portion of the data of the one or more packets associated with the first bitmask.

6. The system of claim 1, wherein the first packet comprises both the first bitmask and the first packet error detection code, the one or more packets associated with the first bitmask being only of the first packet.

7. The system of claim 1, wherein the first bitmask is transmitted independently of the first packet and the first packet error detection code.

8. The system of claim 1, wherein the one or more packets associated with the first bitmask are a sequence of packets transmitted after the first bitmask.

9. The system of claim 1, wherein the transmitting the first bitmask and the receiving the first bitmask comprise exchanging information from which the transmitting computing device and the receiving computing device can independently derive the first bitmask.

10. The system of claim 1, wherein the first error detection code is an error correction code.

11. The system of claim 1, wherein the first bitmask comprises a first set of bits indicating whether any of the first and second contiguous ranges of data are to be included in the generation of the packet error detection code and a second set of bits separately indicating whether any of the first and second contiguous ranges of data are to be included in the generation of a packet error correction code.

12. The system of claim 1, wherein the first bitmask comprises a code that corresponds to the indication that the first contiguous range of data is to be included in the generation of the packet error detection code and that the second contiguous range of data is to be excluded from the generation of the packet error detection code, the code and the corresponding indication being part of a dictionary of codes and corresponding indications that is accessible by both the transmitting and receiving computing devices.

13. The system of claim 1, wherein the first bitmask indicates that the first contiguous range of data is to be included in the generation of the packet error detection code by omitting an identification of the first contiguous range of data, the first bitmask only identifying ranges of data that are be excluded from the generation of the packet error detection code.

14. The system of claim 1, wherein the first bitmask indicates that the second contiguous range of data is to be excluded from the generation of the packet error detection code by comprising no identification of the second contiguous range of data, the first bitmask only identifying ranges of data that are be included in the generation of the packet error detection code.

15. The system of claim 1, wherein the computer-executable instructions for transmitting the first bitmask, the first packet and the first packet error detection code comprise computer-executable instructions, which, when executed by at least some of the transmitting computing device processing units, cause the transmitting computing device to:
encapsulate the first bitmask, the first packet and the first packet error detection code into a payload of a second packet; and
transmit the second packet.

16. The system of claim 1, wherein the one or more transmitting computing device storage media comprise further computer-executable instructions, which, when executed by at least some of the transmitting computing device processing units, cause the transmitting computing device to:
receive a second packet associated with a second bitmask, the second bitmask indicating that a first contiguous range of data of the second packet is to be included in the generation of the packet error detection code and that a second contiguous range of data of the second packet is to be excluded from the generation of the packet error detection code; and
encapsulate the second packet into a payload of the first packet;
wherein the generating the first bitmask is based on the second bitmask.

17. The system of claim 16, wherein the generating the first bitmask comprises:
delineating the first contiguous range of data of the first packet, associated with the first bitmask, to correspond to the first contiguous range of data of the second packet, as encapsulated into the payload of the first packet; and
delineating the second contiguous range of data of the first packet, associated with the first bitmask, to correspond to the second contiguous range of data of the second packet, as encapsulated into the payload of the first packet.

18. The system of claim 1, wherein the receiving computing device implements cut-through routing to avoid error detection of received packets at a data link layer.

19. A method of generating a packet, for transmitting digital data across a network, where only a portion of a payload of the packet is protected against transmission errors, the method comprising:
generating, at a transmitting computing device, a first bitmask indicating that a first contiguous range of data of one or more packets associated with the first bitmask is to be included in the generation of a packet error detection code and that a second contiguous range of data of the one or more packets associated with the first bitmask is to be excluded from the generation of the packet error detection code, the second contiguous range of data being closer to a beginning of the one or more packets associated with the first bitmask than the first contiguous range, wherein each packet of the one or more packets associated with the first bitmask has only a single corresponding packet error detection code generated in accordance with the first bitmask;
generating, at the transmitting computing device, for a first packet, a first packet error detection code based on data of the first packet that is within the first contiguous range of data, to the exclusion of data of the first packet that is within the second contiguous range of data, the first packet being one of the packets associated with the first bitmask; and
transmitting, from the transmitting computing device, the first bitmask, the first packet and the first packet error detection code across the network.

20. A method of receiving a packet, transporting digital data across a network, where only a portion of a payload of the packet is checked for transmission errors, the method comprising:
- receiving, at a receiving computing device, a first bitmask, a first packet and a first packet error detection code, the first packet error detection code being an only error detection code received for the first packet, the first packet being associated with the first bitmask, the first bitmask indicating that a first contiguous range of data of the first packet was included in the generation of the first packet error detection code and that a second contiguous range of data of the first packet was excluded from the generation of the first packet error detection code, the second contiguous range of data being closer to a beginning of the first packet than the first contiguous range;
- generating, at the receiving computing device, another instance of the first packet error detection code based on data of the received first packet that is within the first contiguous range of data, to the exclusion of data of the received first packet that is within the second contiguous range of data; and
- discarding, from the receiving computing device, the received first packet if the generated instance of the first packet error detection code differs from the received first packet error detection code;
- wherein the received first packet is retained as correctly received even though there are differences between the first packet as transmitted and the first packet as received, if the differences are within the second contiguous range of data.

* * * * *